(12) United States Patent
Xue et al.

(10) Patent No.: US 11,470,742 B2
(45) Date of Patent: Oct. 11, 2022

(54) COOLING CASING AND COOLING DEVICE APPLIED TO VEHICLE AND IN-VEHICLE SERVER

(71) Applicants: Inventec (Pudong) Technology Corporation, Shanghai (CN); INVENTEC CORPORATION, Taipei (TW)

(72) Inventors: Dong-rui Xue, Shanghai (CN); Xuefeng Chen, Shanghai (CN); Pinyi Xiang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/029,053

(22) Filed: Sep. 23, 2020

(65) Prior Publication Data
US 2021/0298201 A1 Sep. 23, 2021

(30) Foreign Application Priority Data
Mar. 17, 2020 (CN) .......................... 202010187751.4

(51) Int. Cl.
*H05K 7/20* (2006.01)
*B60R 16/023* (2006.01)

(52) U.S. Cl.
CPC ..... *H05K 7/20272* (2013.01); *B60R 16/0238* (2013.01); *H05K 7/20781* (2013.01)

(58) Field of Classification Search
None
See application file for complete search history.

(56) References Cited

U.S. PATENT DOCUMENTS

| | | | | |
|---|---|---|---|---|
| 8,665,591 | B2* | 3/2014 | Bourgeois | H01M 10/486 |
| | | | | 361/679.5 |
| 9,439,327 | B1* | 9/2016 | Sheng | H05K 7/20572 |
| 9,500,416 | B2* | 11/2016 | Nguyen | F28F 3/12 |
| 9,544,988 | B2* | 1/2017 | Suzuki | F28D 15/0266 |
| 10,127,949 | B2* | 11/2018 | Mayhall | G11B 33/027 |
| 10,279,760 | B2* | 5/2019 | Froeschl | H02G 3/03 |
| 10,905,031 | B1* | 1/2021 | Gao | H05K 7/20781 |
| 10,976,215 | B2* | 4/2021 | Mundt | H05K 7/20272 |
| 10,980,154 | B1* | 4/2021 | Gao | H05K 7/20636 |
| 2012/0155027 | A1* | 6/2012 | Broome | H05K 7/2039 |
| | | | | 361/688 |
| 2014/0309934 | A1* | 10/2014 | Ricci | B60R 25/25 |
| | | | | 701/537 |
| 2019/0111938 | A1* | 4/2019 | Chen | H04L 41/0806 |
| 2020/0328139 | A1* | 10/2020 | Chiu | H01L 23/473 |
| 2021/0072071 | A1* | 3/2021 | Qi | G06Q 10/0635 |

* cited by examiner

*Primary Examiner* — Courtney L Smith

(57) ABSTRACT

The present disclosure provides a cooling casing and a cooling device applied to a vehicle and an in-vehicle server. The cooling device applied to the in-vehicle server includes: a first housing and a second housing, an accommodating cavity is formed between the first housing and the second housing; and a cooling duct, the cooling duct being spirally disposed in the accommodating cavity, two ends of the cooling duct are connected to an external cooling system, and the cooling duct is filled with cooling liquid. The present disclosure is simple in structure and low in costs, and can effectively resolve the heat dissipation problem of the in-vehicle server.

7 Claims, 4 Drawing Sheets

COOLING CASING AND COOLING DEVICE APPLIED TO VEHICLE AND IN-VEHICLE SERVER

CROSS REFERENCES TO RELATED APPLICATIONS

This application claims the benefits of priority to Chinese Patent Application No. CN 2020101877514, entitled "Cooling Casing and Cooling Device Applied to Vehicle and In-Vehicle Server", filed with CNIPO on Mar. 17, 2020, the contents of which are incorporated herein by reference in its entirety.

TECHNICAL FIELD

The present disclosure relates to the heat dissipation field of in-vehicle servers, and in particular, to a cooling casing and a cooling device applied to a vehicle and an in-vehicle server.

BACKGROUND

With the rapid development of emerging technologies such as intelligent driving, 5G, and block chain, the market size of edge servers is rapidly increasing. However, the edge server market still faces challenges from many aspects such as a deployment environment, security, durability, computing density, compatibility, and universality, which affects the use effect and experience of a user.

Currently, to realize automatic driving of a vehicle, an in-vehicle server is generally disposed in the automatic driving vehicle. As one type of edge server, the heat dissipation problem in-vehicle server has attracted much attention.

SUMMARY

The present disclosure provides a cooling casing and a cooling device applied to a vehicle and an in-vehicle server thereof, to resolve the heat dissipation problem of the in-vehicle server in the existing technology.

The present disclosure provides a cooling device, applied to an in-vehicle server, the cooling device including: a first housing-part and a second housing-part, an accommodating cavity is formed between the first housing-part and the second housing-part; and a cooling duct, the cooling duct is spirally disposed in the accommodating cavity, two ends of the cooling duct are used for connecting to an external cooling system, and the cooling duct is filled with cooling liquid.

In an embodiment of the present disclosure, the first housing-part is attached to a surface of a chassis of the in-vehicle server, and the cooling duct is coiled in a snake-like manner along the surface of the chassis.

In an embodiment of the present disclosure, an installation groove is disposed inside the accommodating cavity, and the cooling duct is embedded in the installation groove.

In an embodiment of the present disclosure, a groove surface of the installation groove is arc-shaped and fits an outer surface of the cooling duct.

In an embodiment of the present disclosure, filling solder is disposed between a groove surface of the installation groove and an outer surface of the cooling duct.

In an embodiment of the present disclosure, the two ends of the cooling duct separately are connected with the external cooling system through a liquid circulation connector.

In an embodiment of the present disclosure, the first housing-part and the second housing-part are soldered together.

The present disclosure provides a cooling casing of an in-vehicle server, including: at least two cooling devices of the in-vehicle server, where the cooling devices are respectively disposed on different casing surfaces of the in-vehicle server, and the cooling ducts of the cooling devices are connected end-to-end to form a communicating cooling duct.

The present disclosure provides an in-vehicle server, including the cooling casing of the in-vehicle server.

The present disclosure provides a vehicle, including the in-vehicle server.

As mentioned above, the cooling casing and the in-vehicle server applied to a vehicle and an in-vehicle server thereof in the present disclosure include: a first housing-part and a second housing-part, an accommodating cavity is formed between the first housing-part and the second housing-part; and a cooling duct, the cooling duct is spirally disposed in the accommodating cavity, two ends of the cooling duct are connected to an external cooling system, and the cooling duct is filled with cooling liquid. The present disclosure is simple in structure and low in costs, can effectively resolve the heat dissipation problem of the in-vehicle server, and has the following beneficial effects:

1. Relatively small volume, simple structure, and low costs; and
2. Capable of connecting to a cooling system of a vehicle, to perform fast heat dissipation on the in-vehicle server, which helps to prolong the service life of the in-vehicle server, and has high reliability.

DESCRIPTIONS OF REFERENCE NUMERALS

Figure 1:
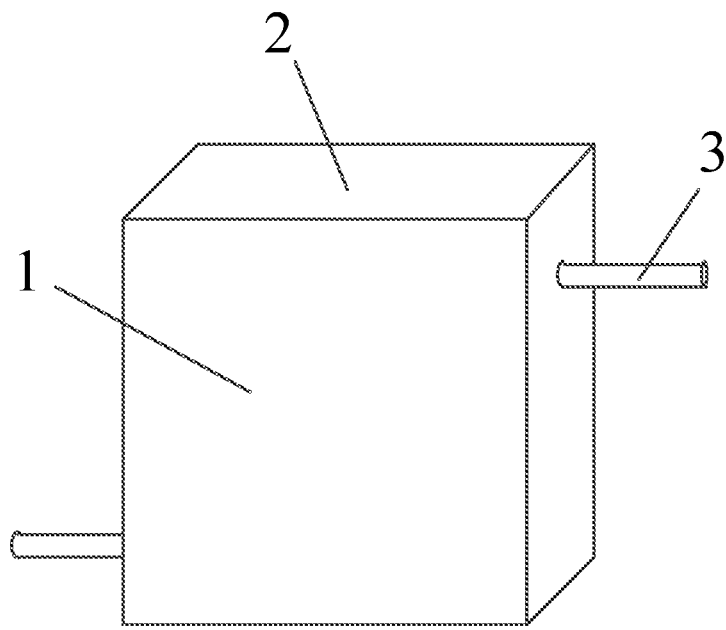
FIG. 1 is a schematic diagram of an external structure of a cooling device of an in-vehicle server in an embodiment of the present disclosure.

1 First housing-part
2 Second housing-part
3 Cooling duct
4 In-vehicle server
41 Casing of in-vehicle server
42 Cooling casing

DETAILED DESCRIPTION OF THE PREFERRED EMBODIMENTS

Implementations of the present disclosure are described below by using specific detailed examples, and a person skilled in the art may easily learn other advantages and effects according to content disclosed in this specification. The present disclosure may alternatively be implemented or applied by using different specific implementations, and various details in this specification may also be modified or changed without departing from the spirit of the present disclosure based on different viewpoints and applications. It should be noted that the following embodiments and features in the embodiments can be combined with each other in a case without conflict.

It should be noted that the drawings provided in the following embodiments only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

Figure 2:
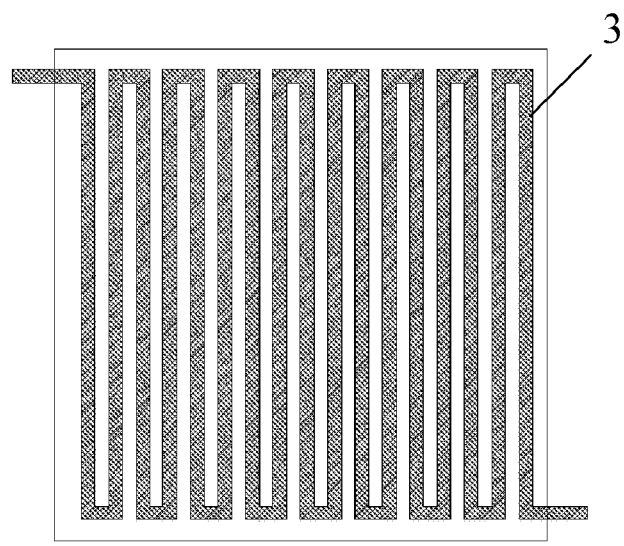
FIG. 2 is a schematic diagram of an internal structure of a cooling device of an in-vehicle server in an embodiment of the present disclosure.

Referring to FIG. 1 and FIG. 2, a cooling device is provided in this embodiment. The cooling device is applied to an in-vehicle server and is configured to perform heat dissipation on the in-vehicle server.

As shown in FIG. 1, the cooling device in this embodiment mainly includes: a first housing-part 1, a second housing-part 2, and a cooling duct 3. Specifically, the first housing-part 1 and the second housing-part 2 form a cubic structure, and the inside of the cubic structure forms an accommodating cavity. The cooling duct 3 is spirally disposed in the accommodating cavity, the cooling duct 3 may be filled with cooling liquid such as ethylene glycol water solution, and two ends of the cooling duct 3 extend out of the accommodating cavity to connect to an external cooling system, for example, a cooling system of a vehicle. The cooling device in this embodiment performs heat dissipation on the in-vehicle server by using the strong convective of the liquid.

It should be noted that, in this embodiment, the first housing-part 1 at least includes a front face of the cubic structure, and the second housing-part 2 includes other faces of the cubic structure except the first housing-part 1. The first housing-part 1 and the second housing-part 2 may be soldered together to be an integrated structure, to increase the strength of the housing-part. In a specific application of heat dissipating of an in-vehicle server, the first housing-part 1 of the cooling device in this embodiment is attached to a surface of a chassis of the in-vehicle server, to perform heat dissipation to the in-vehicle server in a liquid cooling manner. A size of the first housing-part 1 is designed according to a size of the surface of the chassis of the in-vehicle server, the size of the first housing-part 1 should as large as possible without exceeding the size of the surface of the chassis, to increase a contact area between the cooling device and the in-vehicle server, thereby improving the heat dissipation effect. Based on this, the thickness of the cooling device should be as small as possible, to not occupy too much space inside the vehicle while performing heat dissipation on the in-vehicle server.

It should be noted that, in other embodiments, the two ends of the cooling duct 3 are located inside the accommodating cavity or located at edges of the accommodating cavity, rather than extend out of the accommodating cavity. This is not limited in the present disclosure. The two ends of the cooling duct 3 may separately connect to the external cooling system through a liquid circulation connector, to enable the external cooling system to bring the heat of the cooling duct 3 out.

Figure 3:
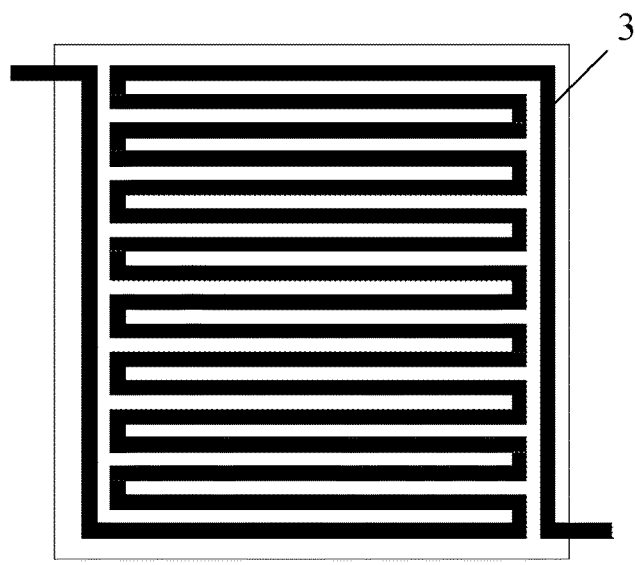
FIG. 3 is a schematic diagram of an internal structure of a cooling device of an in-vehicle server in another embodiment of the present disclosure.
Figure 4:
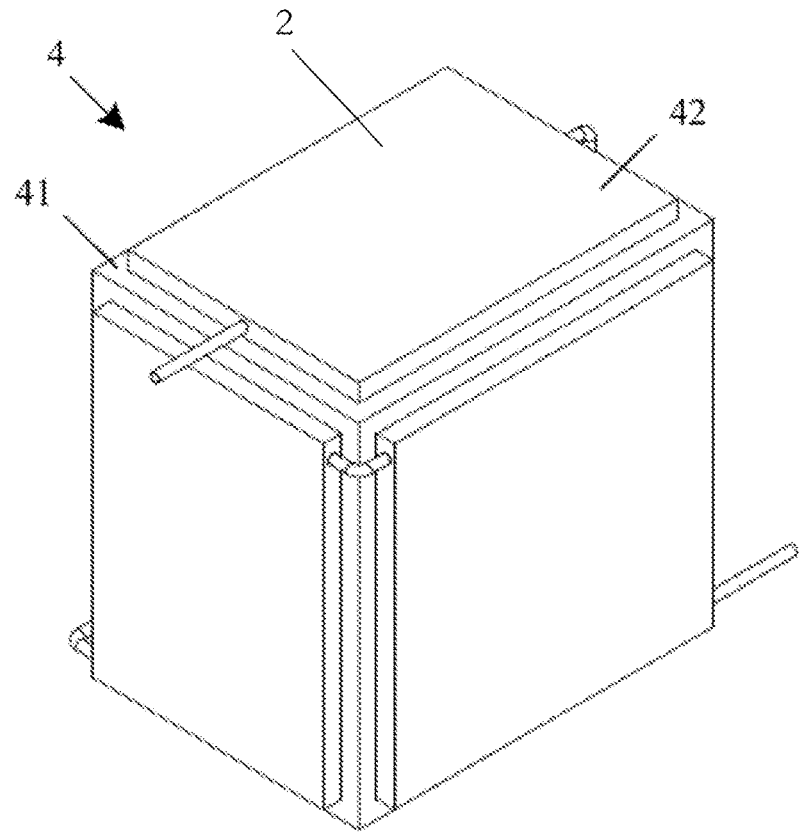
FIG. 4 is a schematic diagram of a schematic diagram of an in-vehicle server including a cooling casing in an embodiment of the present disclosure.
Figure 5:
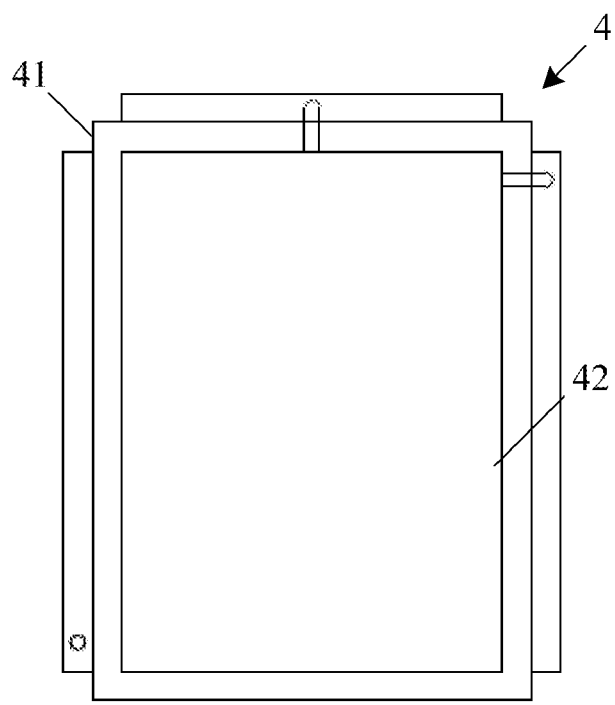
FIG. 5 is a back view of an in-vehicle server including a cooling casing in an embodiment of the present disclosure.
Figure 6:
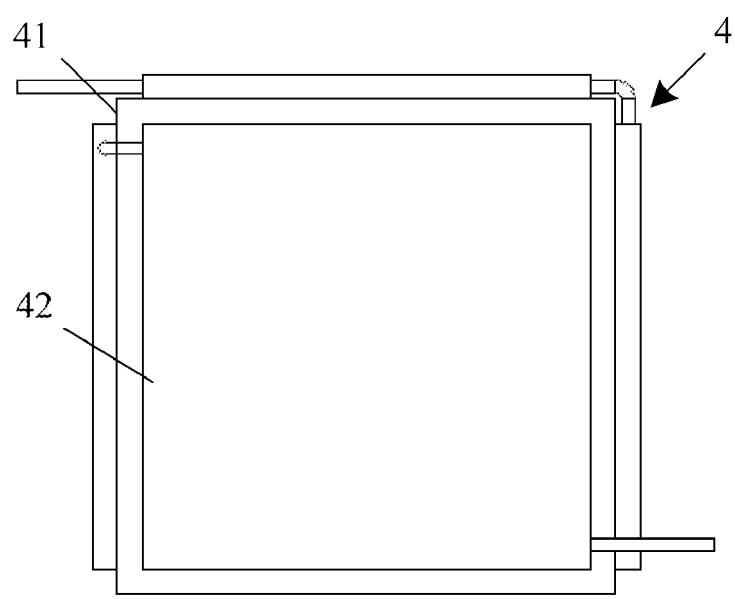
FIG. 6 is a side view of an in-vehicle server including a cooling casing in an embodiment of the present disclosure.
Figure 7:
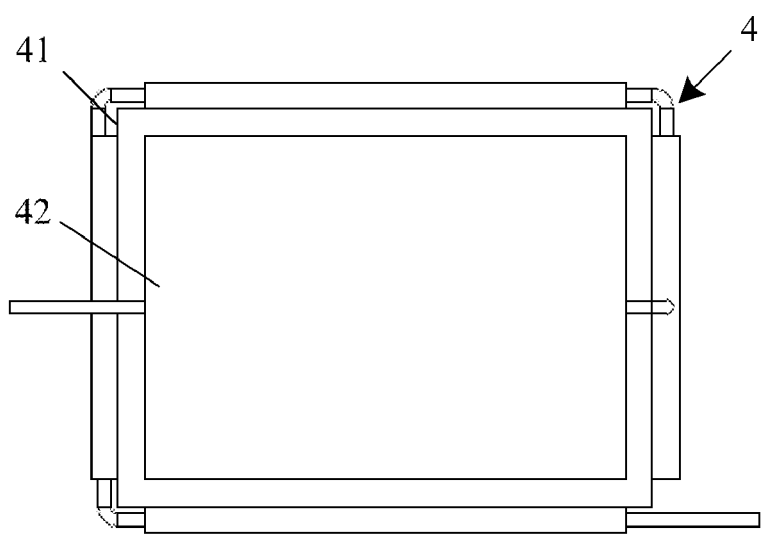
FIG. 7 is a bottom view of an in-vehicle server including a cooling casing in an embodiment of the present disclosure.

As shown in FIG. 2, in this embodiment, the cooling duct 3 is in a longitudinal snake shape in a plane and is spirally disposed in the accommodating cavity. As shown in FIG. 3, in another embodiment, the cooling duct 3 is in a transverse snake shape and is spirally disposed in the accommodating cavity.

It should be noted that, an effect of coiling the cooling duct 3 in a snakelike manner lies in increasing the contact area between the cooling liquid and the in-vehicle server, to improve the heat dissipation effect. A person skilled in the art may design a layout trend of the cooling duct 3 according to an actual situation, which is not limited to the structures in FIG. 2 and FIG. 3.

In an embodiment of the present disclosure, an installation groove is disposed inside the accommodating cavity, and the cooling duct 3 is embedded in the installation groove. Specifically, the installation groove is disposed on an inner surface of the first housing-part 1, and a groove surface of the installation groove is arc-shaped to fit an outer surface of the cooling duct 3. When the groove surface of the installation groove is in a semi-circle shape, and the groove surface is closely attached to the outer surface of the cooling duct 3, the heat is conducted more quickly. Further, in an embodiment of the present disclosure, filling solder is disposed between the groove surface of the installation groove and the outer surface of the cooling duct 3, to reduce a gap between the arc-shaped groove and the cooling duct 3 and improve the heat dissipation effect.

Referring to FIGS. 4 to 7, this embodiment provides a cooling casing 42 of an in-vehicle server, and the cooling casing includes: at least two cooling devices of the in-vehicle server according to the foregoing embodiment. The cooling devices are respectively disposed on different casing surfaces of the in-vehicle server, and cooling ducts of the cooling devices are connected end-to-end to form a communicating cooling duct. In this way, the cooling duct is coiled in accommodating cavities in the surfaces, to effectively increase a heat transfer area.

Specifically, the cooling casing 42 of an in-vehicle server in this embodiment includes a total of six cooling devices in the foregoing embodiment that are respectively disposed on front, rear, top, bottom, left, and right surfaces of a casing 41 of the in-vehicle server 4. Cooling ducts of the six cooling devices are sequentially connected end-to-end, to form a communicating cooling duct. The cooling liquid enters from one end of the communicating cooling duct, and flows out from the other end after flowing through the cooling devices to perform heat dissipation on the surfaces of the in-vehicle server.

In addition, the present disclosure further provides an in-vehicle server including the foregoing cooling casing of an in-vehicle server, and a vehicle including the in-vehicle server. Because specific implementations are described in detail above, details are not described herein again.

Based on the above, the cooling casing and the cooling device applied to a vehicle and an in-vehicle server in the present disclosure are simple in structure and low in costs, and can effectively resolve the heat dissipation problem of the in-vehicle server, therefore effectively overcome various disadvantages in the existing technology, so that the present disclosure has a high industrial utilization value.

The above embodiments merely exemplify the principles and effects of the present disclosure, but are not intended to limit the present disclosure. Any person skilled in the art can modify or change the above embodiments without departing from the spirit and scope of the present disclosure. Therefore, all equivalent modifications or changes made by those of ordinary skill in the art without departing from the spirit and technical ideas disclosed by the present disclosure should still fall within the scope of the claims of the present disclosure.

What is claimed is:

1. A cooling device, applied to an in-vehicle server, comprising:
    a first housing-part and a second housing-part, wherein an accommodating cavity is formed by the first housing-part and the second housing-part; and
    a cooling duct, wherein the cooling duct is spirally disposed in the accommodating cavity, two ends of the cooling duct extend out of the accommodating cavity are connected to an external cooling system, and the cooling duct is filled with cooling liquid,
    wherein the first housing is attached to a surface of a chassis of the in-vehicle server, and the cooling duct is coiled in a snakelike manner along the surface of the chassis,
    wherein an installation groove is disposed inside the accommodating cavity, and the cooling duct is embedded in the installation groove, wherein a groove surface of the installation groove is arc-shaped and fits an outer surface of the cooling duct.

2. The cooling device according to claim 1, wherein filling solder is disposed between a groove surface of the installation groove and an outer surface of the cooling duct.

3. The cooling device according to claim 1, wherein the two ends of the cooling duct separately are connected with the external cooling system through a liquid circulation connector.

4. The cooling device according to claim 1, wherein the first housing-part and the second housing-part are soldered together.

5. A cooling casing of an in-vehicle server, comprising: at least two cooling devices of the in-vehicle server according to claim 1, wherein the cooling devices are respectively disposed on different casing surfaces of the in-vehicle server, and cooling ducts of the cooling devices are connected end-to-end to form a communicating cooling duct.

6. An in-vehicle server, comprising the cooling casing of the in-vehicle server according to claim 5.

7. A vehicle, comprising the in-vehicle server according to claim 6.

* * * * *